(12) United States Patent
Shinde

(10) Patent No.: US 8,390,356 B2
(45) Date of Patent: Mar. 5, 2013

(54) METHOD AND SYSTEM FOR OPEN LOOP COMPENSATION OF DELAY VARIATIONS IN A DELAY LINE

(75) Inventor: Suhas Vishwasrao Shinde, Pune (IN)

(73) Assignee: KPIT Cummins Infosystems, Ltd., Pune, IN (US)

( * ) Notice: Subject to any disclaimer, the term of this patent is extended or adjusted under 35 U.S.C. 154(b) by 94 days.

(21) Appl. No.: 13/059,911

(22) PCT Filed: May 8, 2009

(86) PCT No.: PCT/IN2009/000273
§ 371 (c)(1),
(2), (4) Date: Feb. 18, 2011

(87) PCT Pub. No.: WO2010/079503
PCT Pub. Date: Jul. 15, 2010

(65) Prior Publication Data
US 2011/0204958 A1    Aug. 25, 2011

(30) Foreign Application Priority Data

May 8, 2008    (IN) .......................... 986/MUM/2008

(51) Int. Cl.
*H03K 17/14*    (2006.01)
*H03K 3/011*    (2006.01)
(52) U.S. Cl. ....................... 327/262; 327/513
(58) Field of Classification Search .......... None
See application file for complete search history.

(56) References Cited

U.S. PATENT DOCUMENTS

| | | | |
|---|---|---|---|
| 5,453,709 A * | 9/1995 | Tanimoto et al. | 327/276 |
| 5,892,409 A | 4/1999 | Boerstler | |
| 5,905,412 A | 5/1999 | Rasmussen | |
| 6,262,616 B1 | 7/2001 | Srinivasan et al. | |
| 6,522,185 B2 * | 2/2003 | Helt et al. | 327/276 |
| 6,803,803 B1 * | 10/2004 | Starr et al. | 327/378 |
| 7,148,732 B2 * | 12/2006 | Kakuda et al. | 327/262 |
| 7,495,465 B2 * | 2/2009 | Khan et al. | 326/26 |
| 2002/0118056 A1 | 8/2002 | Helt et al. | |
| 2007/0182472 A1 | 8/2007 | Cho | |
| 2010/0253406 A1 * | 10/2010 | Seefeldt et al. | 327/161 |

* cited by examiner

*Primary Examiner* — Lincoln Donovan
*Assistant Examiner* — Terry L Englund
(74) *Attorney, Agent, or Firm* — Kramer & Amado, P.C.

(57) ABSTRACT

The present invention provides a method and system for open loop compensation of delay variations in a delay line. The method includes sensing the Process, Voltage, Temperature (PVT) variations in the delay line using a sensing circuit. A first and second sensitive current are generated based on the PVT variations. The first and second sensitive currents are mirrored currents from the sensing circuit. Then, a first compensation current is generated based on the first sensitive current and a first summing current. The first summing current is a reference current independent of the PVT variations. Further, the first compensation current is mirrored as a second summing current and a second compensation current is generated from the second sensitive current and the second summing current. The second compensation current compensates the delay variations and has a sensitivity based on the sensitivities of the first and second sensitive currents.

25 Claims, 10 Drawing Sheets

METHOD AND SYSTEM FOR OPEN LOOP COMPENSATION OF DELAY VARIATIONS IN A DELAY LINE

FIELD OF THE INVENTION

The invention relates to delay lines. More specifically, the present invention relates to compensating delay variations in a delay line.

BACKGROUND OF THE INVENTION

Delay line is a device where an input signal reaches the output of the device after a known period of time has elapsed. Delay lines are used to derive precise delay in various electronic devices based on control parameters such as voltage and current. Based on control parameters, two types of delay lines are commonly known, Voltage Controlled Delay Line (VCDL) and Current Controlled Delay line (CCDL). The delay lines are critical functional blocks in Phase-locked loops (PLLs) and Delay-locked loops (DLLs). Delay lines also find applications in programmable devices such as Field Programmable Gate Array (FPGA) and Complex Programmable Logic Device (CPLD). Another application of delay line is in digital direct synthesis (DDS) to reduce time jitter of the signal by using virtual clock enhancement method.

A typical delay line includes multiple delay elements. The delay element is the basic component that generates delay in a delay line. Two commonly used delay elements are CMOS delay elements and differential delay elements. A very basic example of CMOS delay element is a CMOS inverter. Each of the delay element in the delay line is configured to produce a finite delay. However, delay at any chosen tap in a delay line vary over a relatively large range due to variations in operating conditions such as effects of temperature, supply voltage, and device parameter variations. The delay varies in a delay element due to bias current variation and load capacitance variation across process, temperature and supply variations. The process variation is defined in terms of variations in gate oxide thickness, doping concentration and geometry of the delay element. The process variations change the threshold voltage and mobility of the delay element. As a result, delay varies across multiple process corners in a delay line.

Various conventional methods have been used to achieve better delay accuracy and minimize delay variation. One such method employs closed loop feedback around the delay line for PVT compensation at the cost of power in milliwatts. The delay variation is minimized by using feedback in the form of phase or delay locked loop to adjust the delay by tracking the period of a reference clock. Other methods facilitate coarse delay tuning by choosing appropriate delay element and then varying control parameter for fine tuning. However, these schemes require closed loop architecture of delay line, resulting in extra hardware overhead and high current requirement. Therefore, the closed loop architecture is not suitable for low power applications. The method and system of the present invention enable low power open loop compensation of delay variations in a delay line.

OBJECT OF THE INVENTION

It is an object of the invention to provide a method and system for low power open loop compensation of delay variations in a delay line. Another object of the present invention is to achieve a delay accuracy of ±10% across all process, temperature and supply voltage conditions.

SUMMARY OF THE INVENTION

The present invention provides a method and a delay compensation circuit for open loop compensation of delay variations in a delay line. The method comprises the steps of sensing the Process, Voltage, Temperature (PVT) variations in the delay line using a sensing circuit, generating a first and a second sensitive current based on the PVT variations and generating a first compensation current based on the first sensitive current and a first summing current. The first summing current is a reference current independent of the PVT variations. The method further comprises mirroring the first compensation current as a second summing current and generating a second compensation current from the second sensitive current and the second summing current. The second compensation current compensates the delay variations and has a sensitivity based on the sensitivities of the first and second sensitive currents.

DETAILED DESCRIPTION OF THE INVENTION

Various embodiments of the present invention are described herein in the context of delay line systems. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementation of the present invention as illustrated in the accompanying drawings. The same reference indicators will be used throughout the drawings and the following detailed description to refer to the same or like parts.

Figure 1:
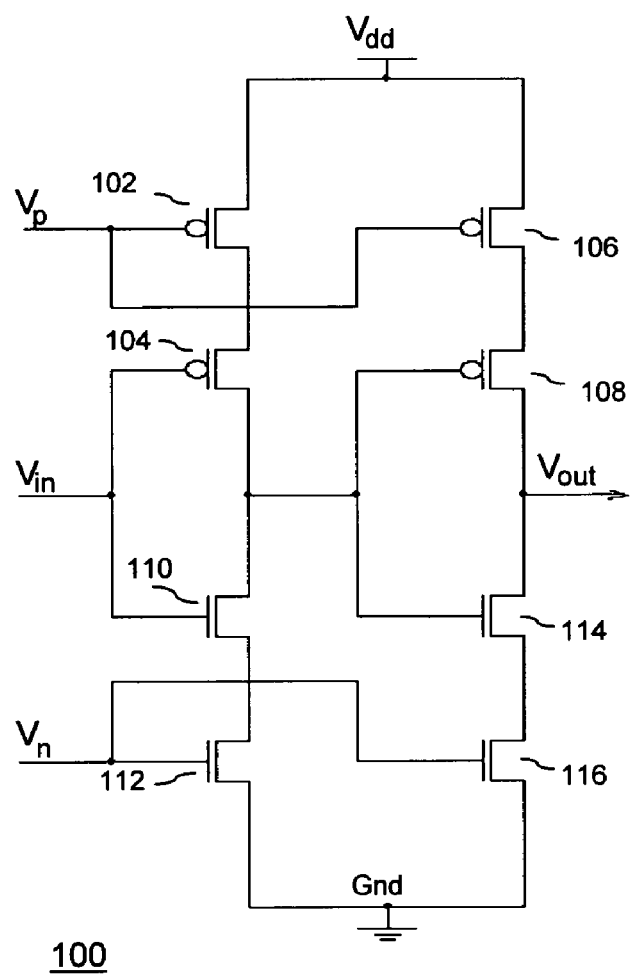
FIG. 1 illustrates an NP-current controlled delay element of the present invention.

FIG. 1 illustrates an NP-current controlled delay element 100 of the present invention. The NP-current controlled delay element 100 can be used to generate precise time delay in various integrated circuits such as Flash Memory Interface, Phase locked loop (PLL), Delay Locked Loop (DLL) and Field Programmable Gate Array (FPGA). FIG. 1 illustrates the architecture of a typical NP-current controlled delay element 100. The NP-current controlled delay element 100 includes PMOS transistors 102, 104, 106 and 108 and NMOS transistors 110, 112, 114 and 116. These transistors are connected based on a current starved architecture. $V_{in}$ is the input voltage and $V_{out}$ is the delayed voltage. The delay in the delay element can be controlled by changing the source/sink currents, hereinafter referred to as the bias current. The time delay $T_d$ produced by the NP-current controlled delay element 100 is given by, $$T_d = V_{DD} \cdot C_L / 2I$$

where $C_1$ is load capacitor seen at the output node of the NP-current controlled delay element 100. 'I' is the bias current for the delay element and it can be changed by changing the bias voltages $V_p$ and $V_n$. Further, $V_{dd}$ is the voltage supply and can also be referred to as output swing (rail to rail swing).

In accordance with an embodiment of the present invention, one or more NP-current controlled delay elements 100 can be cascaded to form a Current Controlled Delay Line (CCDL). The total delay produced by a CCDL can be given by, $$\text{Total delay} = N \times T_d$$

Where $T_d$=delay/stage (Delay resolution)
N=Number of tap delay elements

In accordance with another embodiment of the present invention, the CCDL described here is for 26 delay taps to choose the delay in fixed steps. The CCDL presented in the present invention is an Analog Delay line (ADL) and uses 14-tap delay elements (TD) and 2-dummy delay (DD) elements to eliminate the asymmetric loading of the delay stages. The ADL is further explained in detail with reference to a delay line architecture in the FIG. 2.

Figure 2:
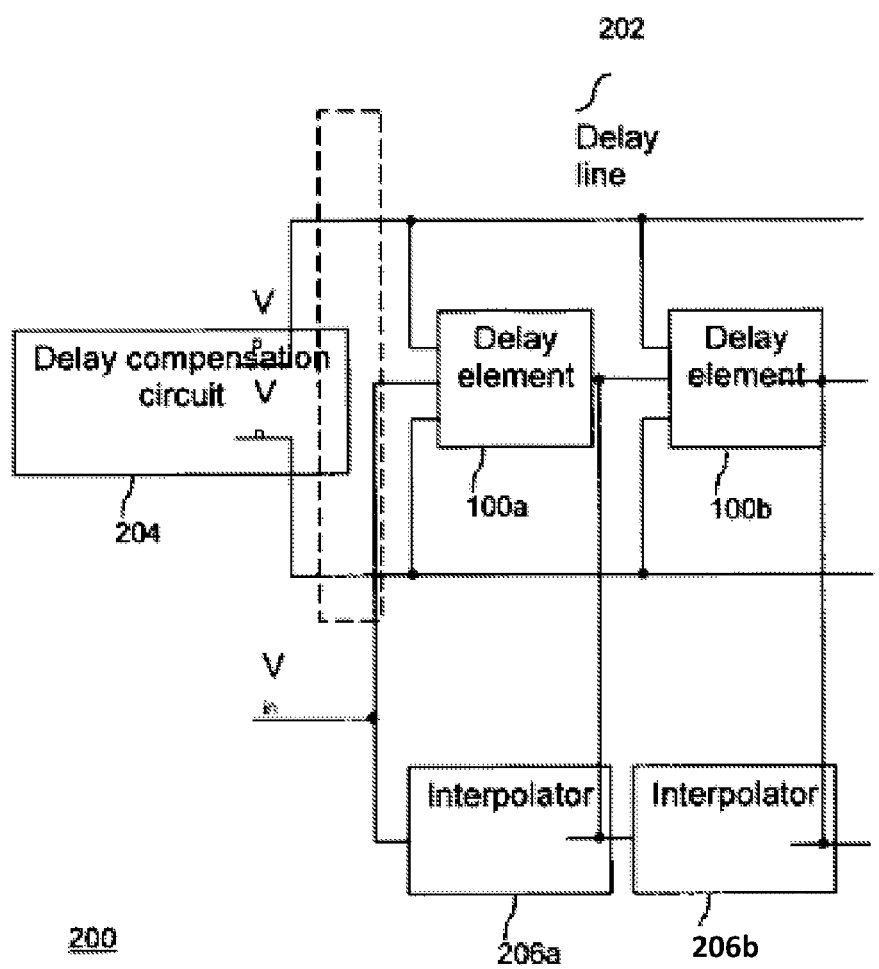
FIG. 2 is a block diagram illustrating a delay line architecture.

FIG. 2 is a block diagram illustrating the delay line architecture 200 of the present invention. The delay line architecture 200 includes the delay line 202, a delay compensation circuit 204 and interpolators 206a and 206b. The delay line 202 is a current controlled ADL and can be used to generate a delayed version of the input voltage $V_{in}$. The delay line 202 includes delay elements 100a and 100b that are cascaded together to generate total delay. The delay elements 100a and 100b are NP-current controlled delay elements 100. In accordance with an embodiment of the present invention, the delay line 202 can include more than two delay elements, however, for the sake of clarity of the description of the present invention, only two delay elements have been illustrated in the FIG. 2.

Each of the delay element has delay resolution as $T_d$ and this resolution is limited by the delay of single NP-current controlled delay element. Therefore, one level of interpolation can be used in order to improve the delay resolution $T_d$. As illustrated in the figure, each delay element is connected to an interpolator, for example, delay element 100a is connected to the interpolator 206a, whereas delay element 100b is connected to the interpolator 206b. The input voltage $V_{in}$, is input to the interpolator 206a and the output of the delay element 100b is connected to the input of the interpolator 206b. Interpolation is a common technique to improve the delay resolution $T_d$ and the architecture of the interpolator is already known in the art. Therefore, the details of the interpolator have not been mentioned in the present invention.

However, the delay resolution $T_d$ of the NP-current controlled delay element 100 varies over a relatively large range due to variations in operating conditions such as effects of temperature, supply voltage and device parameter variations during manufacturing of the integrated circuit. As mentioned before, $$\text{Delay resolution } T_d = V_{DD} \cdot C_L / 2I \quad (1)$$

From equation [1], the delay resolution term includes the load capacitance $C_L$, the bias current I and the supply voltage $V_{dd}$ of the NP-current controlled delay element 100. In an integrated circuit, load capacitance $C_L$ varies with process and temperature due to gate oxide thickness variation and geometrical variations of the device. The geometrical variations include variations in dW and dL due to oxide encroachment and lateral diffusion. Further, the bias current variation is due to variation in the supply voltage, threshold voltage and process gain of the device. These variations can be explained with reference to the following formulas:

$$C_L = f(P, T)$$

$$I = f(P, T, V_{DD})$$

where
process, temperature and supply voltage are defined as continuous analog variables.
P: Process
T: Temperature
$V_{dd}$: Supply Voltage From equation [1], the delay resolution $T_d$ term consists of load capacitor, bias current and supply voltage, hence it varies with respect to process, temperature and supply voltage. As a result, $T_d$=f (P, T, $V_{DD}$).

On the basis of above equation, the governing equation of the delay variation can be expressed as $$dT_d = \frac{\partial T_d}{\partial P} \cdot dP + \frac{\partial T_d}{\partial T} \cdot dT + \frac{\partial T_d}{\partial V_{DD}} \cdot dV_{DD}$$

Where,
delay variations with respect to process:

$$\frac{\partial T_d}{\partial P} = \frac{V_{DD}}{2I} \cdot \frac{\partial C_L}{\partial P} - \frac{V_{DD} \cdot C_L}{2I^2} \cdot \frac{\partial I}{\partial P};$$

delay variations with respect to temperature:

$$\frac{\partial T_d}{\partial T} = \frac{V_{DD}}{2I} \cdot \frac{\partial C_L}{\partial P} - \frac{V_{DD} \cdot C_L}{2I^2} \cdot \frac{\partial I}{\partial T}$$

and delay variations with respect to voltage supply:

$$\frac{\partial T_d}{\partial V_{DD}} = \cdot \frac{C_L}{2V_{DD}} - \frac{V_{DD} \cdot C_L}{2I^2} \cdot \frac{\partial I}{\partial V_{DD}}$$

In order to compensate the delay variations in the delay line 202 due to Process, Voltage Supply, Temperature (PVT) variations, the present invention provides a novel delay compensation circuit 204 for low power open loop compensation of delay variations. The delay compensation circuit 204 employs a forward open loop compensation scheme where the PVT variations are sensed and a control current profile is generated which compensates any variations in the delay. The control current profile can be referred to as compensation current and is used to control the bias voltages $V_p$ and $V_n$ of each of the delay elements 100a and 100b. The bias voltages $V_p$ and $V_n$ control the bias current of the each of the delay elements 100a and 100b and therefore control the delay variations.

The delay compensation circuit 204 uses a sensing circuit to sense the PVT variations. The sensing circuit is explained in detail with reference to FIG. 3.

Figure 3:
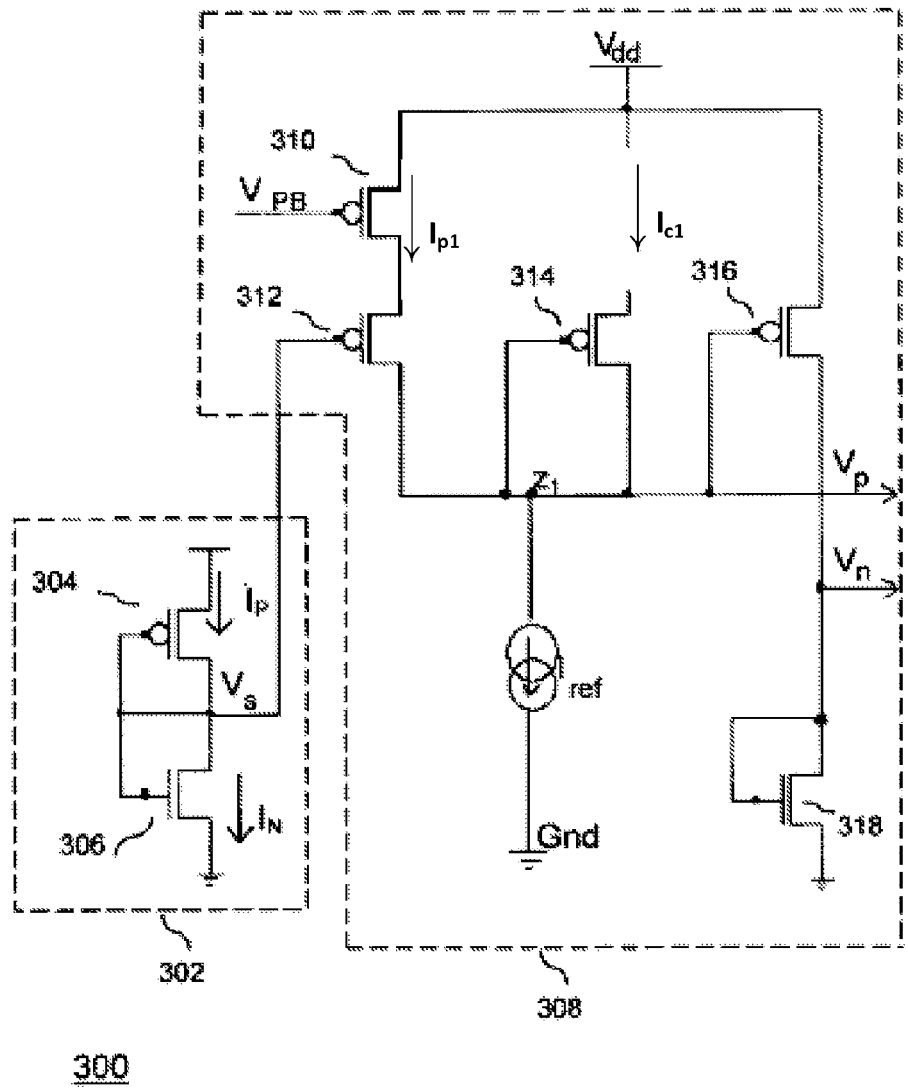
FIG. 3 illustrates a single stage delay compensation circuit.

FIG. 3 illustrates a single stage delay compensation circuit 300 of the present invention. The single stage delay compensation circuit 300 includes a sensing circuit 302 and a first stage circuit 308. The first stage circuit 308 is connected to the sensing circuit 302. The sensing circuit 302 is a basic voltage reference circuit and includes a PMOS 304 and an NMOS 306. The source current $I_P$ at PMOS 304 can be written as $$I_P = \frac{\beta_P}{2}(V_{GSP} - V_{TP})^2$$

Where,
$\beta_P$=process gain of PMOS 304
$V_{GSP}$=Gate-source bias voltage at PMOS 304, where $V_{GSP}$=$V_{DD}$-$V_S$
$V_{DD}$=Voltage Supply
$V_{TP}$=Threshold voltage of PMOS 304
The sink current $I_N$ at NMOS 306 can be written as $$I_N = \frac{\beta_N}{2}(V_{GSN} - V_{TN})^2$$

Where,
$\beta_N$=process gain of NMOS 306
$V_{GSN}$=Gate-source bias voltage at NMOS 306 and $V_{GSN}$=$V_S$
$V_{TN}$=Threshold voltage of NMOS 306
In the sensing circuit 302, both source and sink currents $I_P$ and $I_N$ can be referred to as bias current I. Both threshold voltages $V_{TP}$ and $V_{TN}$ can be commonly referred to as $V_T$. Further, for a NMOS/PMOS, $V_{GSN}$ and $V_{GSP}$ vary according to the variations in the voltage supply $V_{DD}$. As a result, the bias current I vary with variations in $\beta$, $V_T$, and $V_{DD}$, and can be written as, $$I = f(\beta, V_T, V_{DD})$$

The process gain $\beta$ and threshold voltage $V_T$ varies with process and temperature, as illustrated below, $$\beta = f(P,T)$$

$$V_T = f(P,T)$$

Therefore, it can be inferred that the bias current I across PMOS/NMOS varies with PVT variations and $$I = f(P,T,V_{DD})$$

The variation of bias current I with respect to process can be illustrated as:

$$\frac{\partial I}{\partial P} = \frac{(V_{GS} - V_T)^2}{2} \cdot \frac{\partial \beta}{\partial P} - \beta(V_{GS} - V_T) \cdot \frac{\partial V_T}{\partial P}$$

The variation of bias current I with respect to temperature can be illustrated as:

$$\frac{\partial I}{\partial T} = \frac{(V_{GS} - V_T)^2}{2} \cdot \frac{\partial \beta}{\partial T} - \beta(V_{GS} - V_T) \cdot \frac{\partial V_T}{\partial T}$$

Where, $$\frac{\partial \beta}{\partial P}, \frac{\partial \beta}{\partial T}$$

are process gain variations with respect to process and temperature respectively, and $$\frac{\partial V_T}{\partial P}, \frac{\partial \beta}{\partial T}$$

are threshold voltage variations with respect to process and temperature respectively.

In the sensing circuit 302, the geometrical variations are minimized by using large transistor lengths and widths. As a result, negligible mobility and geometrical variations lead to very less variation in process gain as compared to threshold voltage variation of the device. Hence, $$\frac{\partial \beta}{\partial P}$$

can be neglected and the variation in bias currents of the PMOS 304 and NMOS 306 with respect to process can be written as $$\frac{\partial I_P}{\partial P} \approx -\beta_P(V_{GSP} - V_{TP}) \cdot \frac{\partial V_T}{\partial P} \quad [2]$$

$$\frac{\partial I_N}{\partial P} \approx -\beta_N(V_{GSN} - V_{TN}) \cdot \frac{\partial V_T}{\partial P}$$

From the equations [2], it can be inferred that the variation in the bias currents with respect to process is based on the threshold voltage variation with process.

Similarly, the variation in the bias currents with respect to temperature is based on the threshold voltage variation with temperature. This is illustrated from the below equations:

$$\frac{\partial I_P}{\partial T} \approx -\beta_P(V_{GSP} - V_{TP}) \cdot \frac{\partial V_T}{\partial T} \quad [3]$$

$$\frac{\partial I_N}{\partial T} \approx -\beta_N(V_{GSN} - V_{TN}) \cdot \frac{\partial V_T}{\partial T} \quad [3]$$

Above set of four equations [2] and [3] prove that the sensing circuit 302 acts as a threshold voltage sensor for process and temperature variations. Similarly, variation of bias currents $I_P$ and $I_N$ with respect to variations in the voltage supply can be given by, $$\frac{\partial I_P}{\partial V_{DD}} = \beta_P(V_{DD} - V_S - V_{TP}) \quad [4]$$

$$\frac{\partial I_N}{\partial V_{DD}} = 0$$

From the equations [2], [3], and [4], it can be inferred that the current generated by the sensing circuit 302 varies according to the PVT variations and the sensing circuit 302 has non-zero sensitivity for variations in the voltage supply. As a result, the sensing circuit 302 is being used in the delay compensation circuit 204 to facilitate the generation of compensation current to compensate delay variations.

The first stage circuit 308 being connected to the sensing circuit 302 includes a first sensitive transistor 312 which is a PMOS. The first sensitive transistor 312 forms a current mirror with the sensing circuit 302 to generate a first sensitive current $I_{p1}$. $I_{p1}$ is the mirrored current from the sensing circuit 302. It can also be referred to as a first PVT sensitive current as it varies according to the PVT variations.

The first stage circuit 308 further includes a biasing transistor 310 such as a PMOS to provide a pbias (PB) voltage. The pbias voltage depends on the threshold voltage of the PMOS and is used to remove any asymmetries in the first sensitive current $I_{p1}$ due to process skew. The first stage circuit 308 also includes a constant current source to generate a reference current $I_{ref}$. The reference current $I_{ref}$ is constant across all the PVT conditions and has zero sensitivity for the PVT variations. Zero sensitivity for the PVT variations implies that $I_{ref}$ is independent of the PVT variations. In accordance with an embodiment of the present invention, the constant current source generates a reference current of around 2 μA.

The first stage circuit 308 further includes a first compensating transistor 314. In accordance with an embodiment of the present invention, the first compensating transistor 314 is a PMOS and generates a first compensation current $I_{c1}$, by subtracting the first sensitive current from the reference current. The reference current is the sum of the first compensation current and the first sensitive current. Therefore, it can also be referred to as a first summing current. Writing Kirchhoff's Current Law (KCL) at summing junction '$z_1$' gives, $$I_{ref} = I_{p1} + I_{c1} \quad [5]$$

The variations of the currents $I_{ref}$, $I_{p1}$ and $I_{c1}$ with respect to process can be related by the following equation:

$$\frac{\partial I_{ref}}{\partial P} = \frac{\partial I_{P1}}{\partial P} + \frac{\partial I_{C1}}{\partial P}$$

In the circuit analysis, the sensitivity of a first variable with respect to a second variable is a parameter that indicates the variations in the first variable with the variations in the second variable. Sensitivity analysis is usually carried out to analyze the effects of variation in one variable on other variables.

Lets consider when, $S_P$=Sensitivity with respect to the process

Then, the sensitivities of currents $I_{ref}$, $I_{p1}$ and $I_{c1}$ with respect to process can be related as, $$I_{REF} \cdot S_P^{IREF} = I_{P1} \cdot S_P^{IP1} + I_{C1} \cdot S_P^{IC1}$$

As a result, $$S_P^{IC1} = -\frac{I_1}{I_{C1}} S_P^I \quad [6]$$

For the sake of clarity, all the sensitivity analysis in the present invention is shown with respect to the process variable; however, the sensitivity equations will remain valid for temperature and supply variables as well. Further, from the equation [6], it can be inferred that the first compensation current $I_{c1}$ has a sensitivity complement to the sensitivity of the first sensitive current $I_{p1}$. As a result, the sensitivity of the first compensation current $I_{c1}$ can be designed by establishing appropriate weighting for the first sensitive current and the first compensation current.

As mentioned before, that the biasing transistor 310 is being used to remove any asymmetries in the first sensitive current due to process skew. This means that the biasing transistor 310 takes care of the variations in the process. To explain further, there are three types of process variations that can be defined, slow-slow process, typical process and fast-fast process. When the process is slow-slow, the variations in the current with respect to process are less. When the process is fast-fast, the variations in current with respect to process are large. In case of a typical process, there is no variation in current with respect to the process. As a result, the sensitivity of the current towards the fast process corner is greater than the sensitivity towards slow process corner and can be illustrated from the below equation:

$$S_{P_{(SS)}}^{IP1} < S_{P_{(FF)}}^{IP1}$$

The biasing transistor 310 alters the sensitivity of the first sensitive current towards fast process corner in a way such that it is equal to the sensitivity towards slow process corner. Let altered sensitivity of the first sensitive current with respect to process towards fast process corner be, $$S'_{P_{(FF)}}^{IP}$$

From equation [6], $$S_{P_{(SS)}}^{I_{C1}} = -\frac{I_{P1}}{I_{C1}} S_{P_{(SS)}}^{I_{P1}}$$

and $$S_{P_{(FF)}}^{I_{C1}} = -\frac{I_{P1}}{I_{C1}} S_{P_{(FF)}}^{I_{P1}}$$

Altered sensitivity towards fast $$S'^{I_{C1}}_{P_{(FF)}} = -\frac{I_{P1}}{I_{C1}} S'^{I_{P1}}_{P_{(FF)}}$$

process corner gives,
The altered sensitivity towards fast process corner is less than the original sensitivity towards fast process corner, and can be written as, $$S'_{P_{(FF)}}^{IP} < S_{P_{(FF)}}^{IP}$$

As a result, sensitivity towards slow corner is equal to sensitivity towards fast corner, $$S_{P_{(SS)}}^{IC} = -S_{P_{(FF)}}^{IC}$$

The first compensation current $I_{c1}$ can control the bias voltages $V_P$ and $V_N$ and can be used to compensate the delay variations in the delay line 202. Further, the single stage delay compensation circuit 300 described in FIG. 3 is a basic delay compensation model. An advanced delay compensation model can be obtained by cascading two first stage circuits 308. For the cascaded circuit, PMOS 316 and NMOS 318 forms a current mirror and can be used to mirror the first compensation current $I_{c1}$ onto the next stage.

Figure 4:
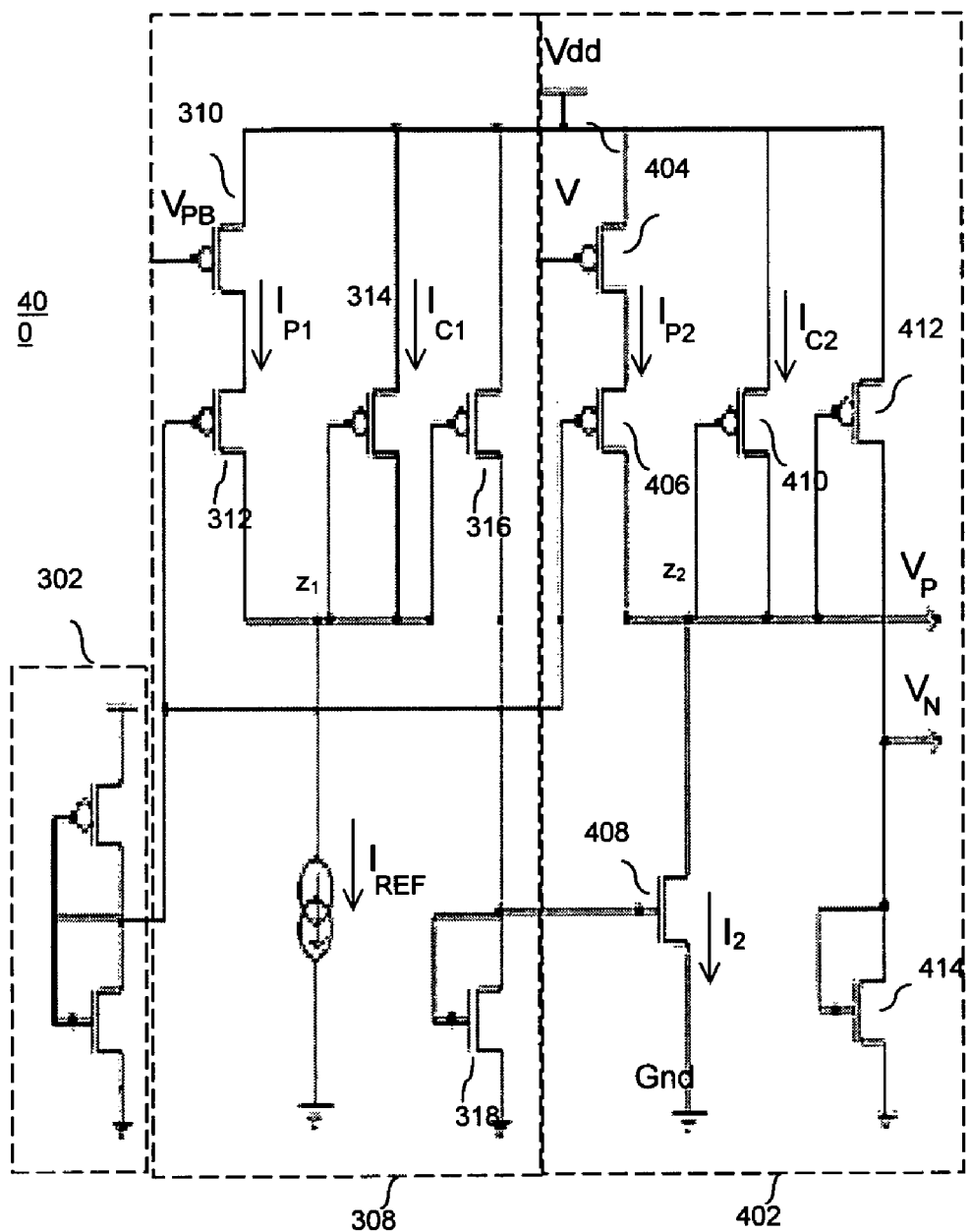
FIG. 4 illustrates a two stage delay compensation circuit of the present invention.

FIG. 4 illustrates a two stage delay compensation circuit 400 of the present invention. The two stage delay compensation circuit 400 can be used to generate a second compensation current $I_{c2}$ in order to compensate for the delay variations in the delay line 202. The two stage delay compensation circuit 400 includes the sensing circuit 302, the first stage circuit 308 and a second stage circuit 402. The architecture of the second stage circuit 402 is similar to that of the first stage circuit 308. Both the first stage circuit 308 and the second stage circuit 402 are connected to the sensing circuit 302. A second sensitive transistor 406 such as a PMOS generates a second sensitive current $I_{p2}$, where the second sensitive current $I_2$ is a mirrored current from the sensing circuit 302. The second stage circuit 402 further includes a biasing transistor 404 such as a PMOS to remove any asymmetries in the second sensitive current $I_{p2}$ due to process skew. The biasing transistor 404 generates a pbias voltage to take care of the process skew.

A second compensating transistor 410 such as a PMOS generates a second compensation current $I_{c2}$ by subtracting the second sensitive current $I_{p2}$ from a second summing current $I_2$. In accordance with an embodiment of the present invention, PMOS 316, NMOS 318 and NMOS 408 forms a first current mirror to mirror the first compensation current $I_{c1}$ as the second summing current $I_2$.

As a result, $I_2 = I_{c1}$ [7]

With reference to FIG. 4, writing KCL at summing junction '$z_2$' gives, $I_2 = I_{p2} + I_{c2}$ [8]

Further, variations of the currents $I_2$, $I_{p2}$ and $I_{c2}$ with respect to process can be defined as:

$$\frac{\partial I_2}{\partial P} = \frac{\partial I_{P2}}{\partial P} + \frac{\partial I_{C2}}{\partial P}$$

Therefore, the sensitivities of currents $I_2$, $I_{p2}$ and $I_{c2}$ with respect to process can be related as, $I_2 S_P^{I2} I_{P2} S_P^{IP2} + I_{C2} S_P^{IC2}$ As a result, $$S_P^{IC2} = \frac{I_2}{I_{c2}} S_P^{I2} - \frac{I_{p2}}{I_{c2}} S_P^{Ip2}$$ (9)

From equation [9], it can be inferred that the sensitivity of the second compensation current depends on the sensitivity of the second sensitive current and the second summing current. Further, the equation [9] brings additional flexibility in adjusting sensitivity of the second compensation current by having non-zero sensitivity for the second summing current.

Further, based on the equations [5], [7] and [8], $I_{c2} = I_2 - I_{p2}$ and $I_2 = I_{c1}$ Therefore, $I_{c2} = I_{c1} - I_{p2}$ $I_{c1} = I_{ref} - I_{p1}$ As a result, $I_{c2} = I_{ref} - (I_{p1} + I_{p2})$ [10]

Since the sensitivity of $I_{ref}$ is zero.
Therefore, sensitivities of the second compensation current, first and second sensitive currents are related as $-I_{C2} \cdot S_P^{IC2} I_{P1} \cdot S_P^{IP1} + I_{p2} \cdot S_P^{Ip2}$ It can now be inferred that the sensitivity of the second compensation current depends on the sensitivity of the first and second sensitive currents. This adds flexibility to the system by making the second compensation current dependent on more than one PVT sensitive currents.

Figure 5:
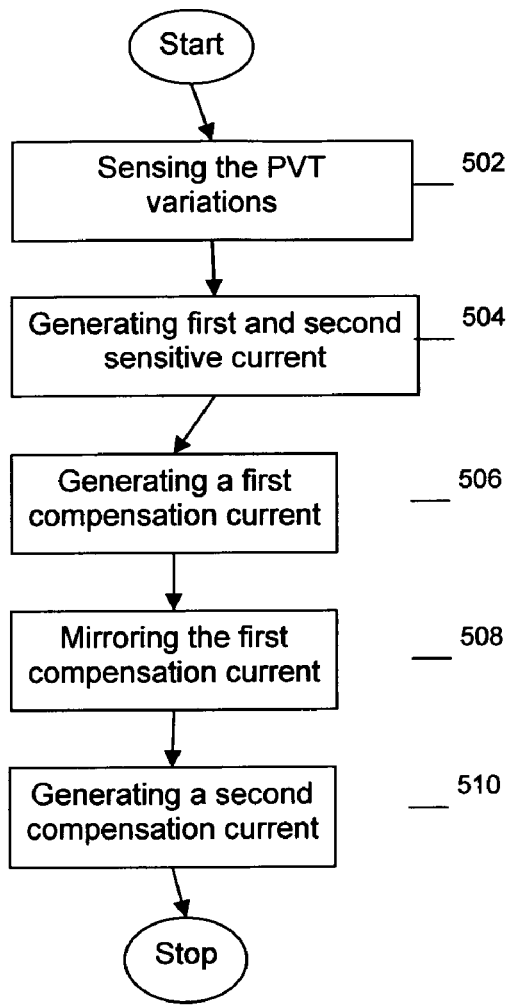
FIG. 5 is a flowchart illustrating a method of open loop delay compensation in accordance with one embodiment of the present invention.

The method of compensation of delay variations in the delay line 202 using the two stage delay compensation circuit is explained in with reference to FIG. 5

FIG. 5 is a flowchart illustrating a method of open loop delay compensation using the two stage delay compensation circuit 400. At step 502, the sensing circuit 302 senses the PVT variations. Further, at step 504, the first sensitive current $I_{p1}$ and the second sensitive currents $I_{p2}$ are generated. The first sensitive current $I_{p1}$ and the second sensitive current $I_{p2}$ are mirrored currents from the sensing circuit 302. At step 506, the first compensation current $I_{c1}$ is generated by subtracting the first sensitive current $I_{p1}$ from the reference current $I_{ref}$. The reference current $I_{ref}$ can also be referred as the first summing current $I_1$. Further at step 508, the first compensation current $I_{c1}$ is being mirrored as the second summing current $I_2$. Furthermore, at step 510, the second compensation current $I_{c2}$ is generated by subtracting the second sensitive current $I_{p2}$ from the second summing current $I_2$. The second compensation current $I_{c2}$ compensates the delay variations and has a sensitivity based on the sensitivity of the first sensitive current $I_{p1}$ and the second sensitive current $I_{p2}$.

Figure 6:
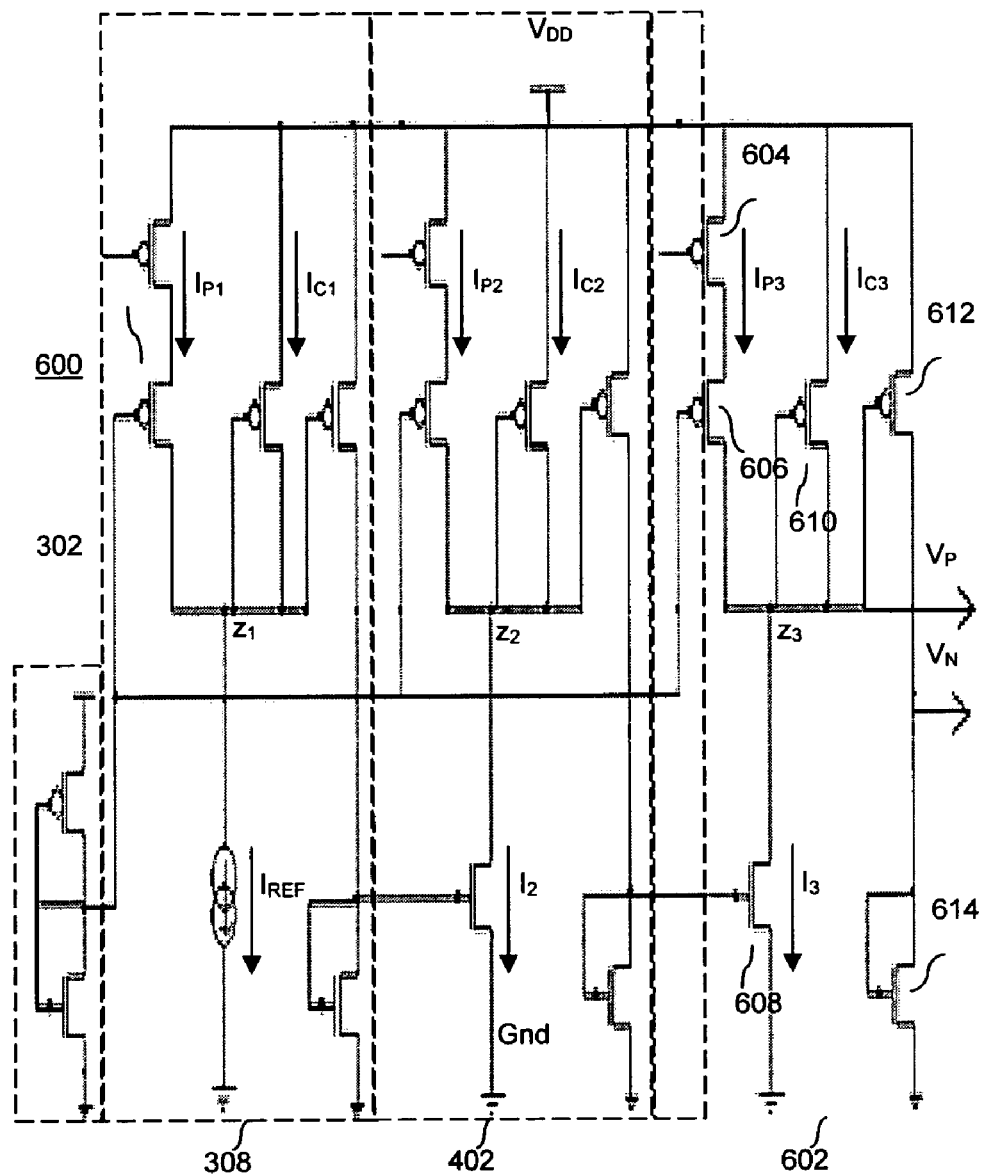
FIG. 6 illustrates a three stage delay compensation circuit.

The second compensation current $I_{c2}$ compensates the delay variations in the delay line 202 and can achieve ±25% delay accuracy across all the PVT conditions. To further enhance the delay accuracy, a three stage delay compensation circuit is provided by cascading three stages of the first stage circuit 308:

FIG. 6 illustrates a three stage delay compensation circuit of the present invention. The three stage delay compensation circuit 600 can be used to generate a third compensation current $I_{c3}$ in order to compensate for the delay variations in the delay line 202. The three stage delay compensation circuit 600 includes the sensing circuit 306, the first stage circuit 308, the second stage circuit 402 and a third stage circuit 602. The architecture of the third stage circuit 602 is similar to that of the second stage circuit 402. Similar to the first and second stage circuits, the third stage circuit 602 is connected to the sensing circuit 302. A third sensitive transistor 606 such as PMOS generates a third sensitive current $I_{p3}$, where the third sensitive current $I_{p3}$ is a mirrored current from the sensing circuit 302. The third stage circuit 602 also includes a biasing transistor 604 such as a PMOS to remove any asymmetries in the third sensitive current $1_3$ due to process skew. The biasing transistor 604 generates a pbias voltage to take care of the process skew.

A third compensating transistor 610 generates a third compensation current $I_{c3}$ by subtracting the third sensitive current $I_{p3}$ from a third summing current $I_3$. In accordance with an embodiment of the present invention, PMOS 412, NMOS 414 and NMOS 608 forms a second current mirror to mirror the second compensation current $I_{c2}$ as the third summing current $I_3$.

As a result, $I_3 = I_{c2}$ [11]

With reference to the FIG. 7, writing KCL at summing junction '$z_3$' gives, $I_3 = I_{p3} + I_{c3}$ [12]

Further, based on the equations [10], [11] and [12], $I_{c3} = I_3 - I_{p3}$ and $I_3 = I_{c2}$ Therefore, $I_{c3} = I_{c2} - I_{p3}$ $I_{c2} = I_{ref} - (I_{p1} + I_{p2})$ Therefore, $I_{c3} = I_{ref} - (I_{p1} + I_{p2} + I_{p3})$ [13]

From equation [13], it implies that the third compensation current $I_{c3}$ is dependent on the reference current $I_{ref}$, the first sensitive current $I_{c3}$, the second sensitive current $I_{c3}$, the third sensitive current $I_{c3}$. As a result, the sensitivity of the third compensation current $I_{c3}$ is based on the sensitivity of the reference current, first, second and third sensitive currents. Since the sensitivity of $I_{ref}$ is zero.
Therefore, $$-I_{C3} \cdot S_P^{IC3} = I_{P1} \cdot S_P^{IP1} + I_{P2} \cdot S_P^{IP2} + I_{P3} \cdot S_P^{IP3} \quad [14]$$

From the above equation [14], the sensitivity of the third compensation current $I_{c3}$ depends on the sensitivity of the first, second and third sensitive currents. This adds flexibility to the delay compensation circuit 204 by making the third compensation current dependent on three PVT sensitive currents.

The third compensation current $I_{c3}$ performs low power compensation of the delay variations in the delay line 202 and can achieve ±10% delay accuracy across all the PVT conditions. Although various embodiments of the present invention have been explained with reference to single, two and three stages delay compensation circuit, the delay compensation circuit 202 can include more than three stages based on the process variations in the delay line.

Figure 7A:
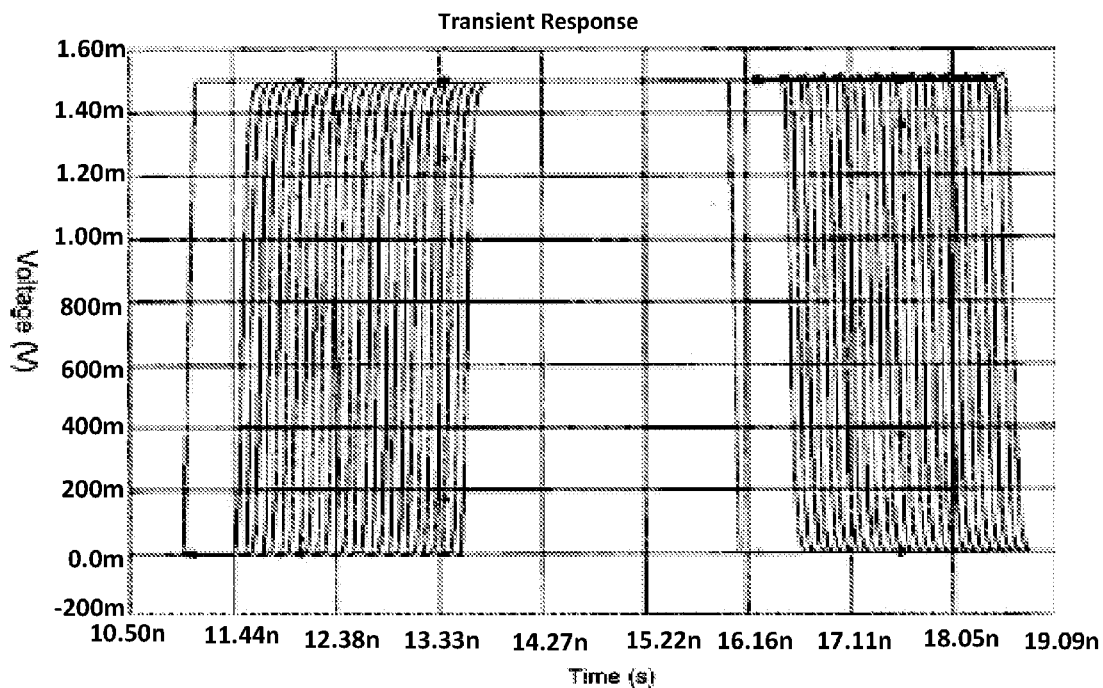
FIGS. 7a and 7b illustrate the simulation results of the input and output signal at the delay line and output at the interpolator respectively.
Figure 7B:
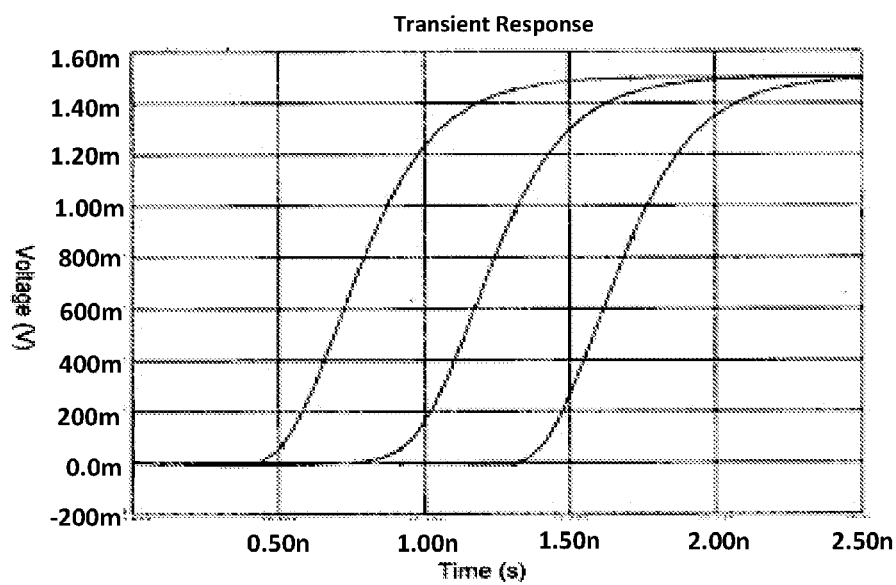
Figure 8A:
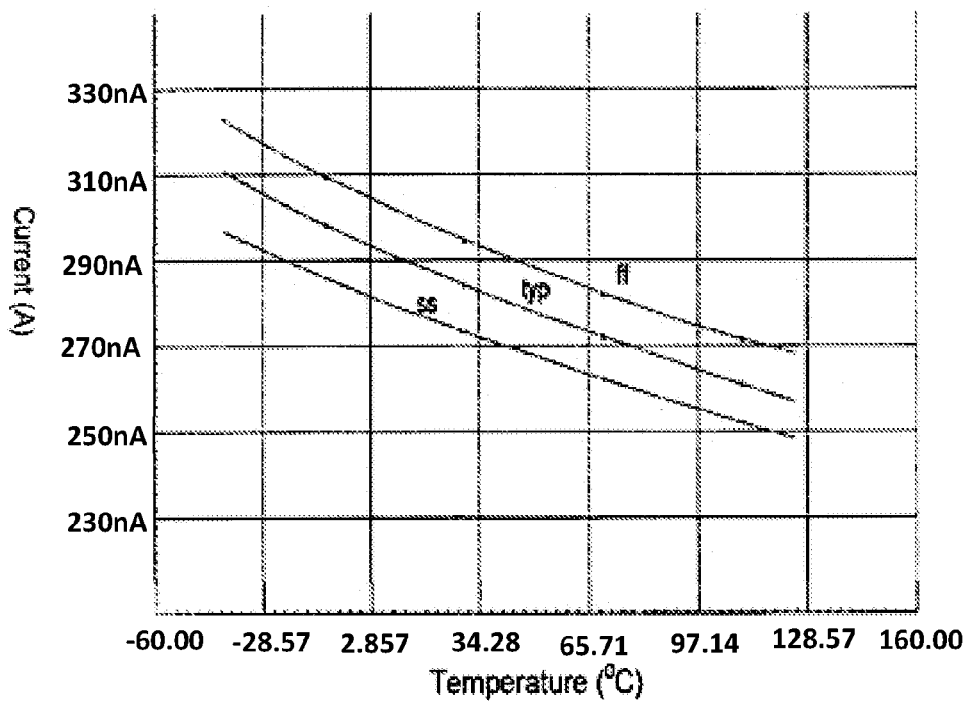
FIGS. 8a and 8b illustrate variations in third sensitive current and third compensation current with process and temperature at typical supply condition.
Figure 8B:
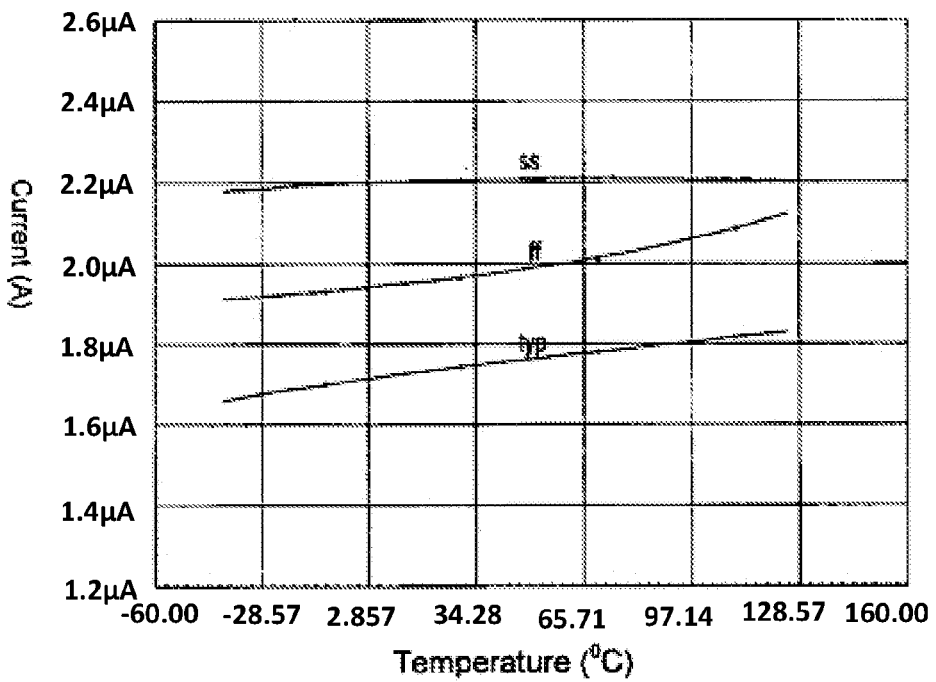
Figure 9A:
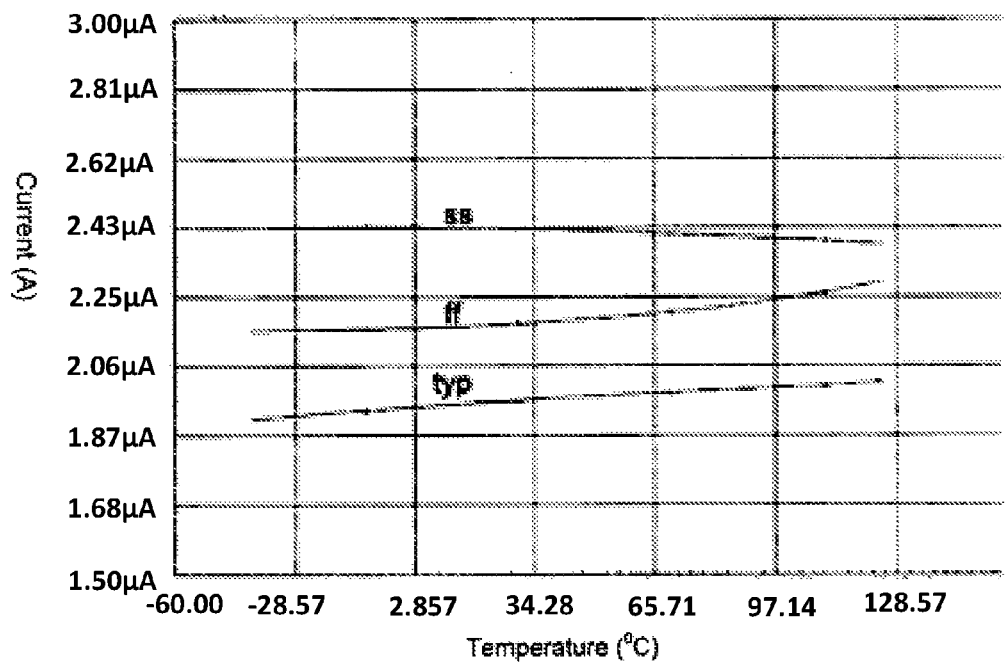
FIGS. 9a and 9b illustrate variations in third summing current with process and temperature at typical supply condition and delay versus process variations for compensated and uncompensated delay line.
Figure 9B:
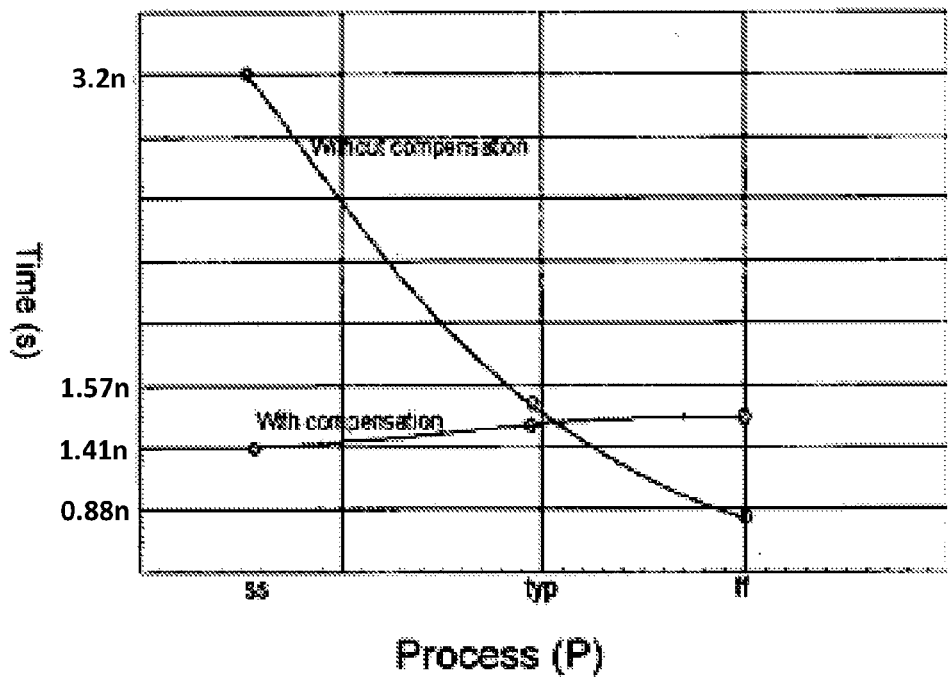

Various simulations have been carried out for the three-stage delay compensation circuit 600 at 1.5 V, 130 nm CMOS process. The temperature range is taken as −40° C. to ±125° C. at ±10% supply variations across multiple process corners. In the simulation results, a fine delay resolution of 82 ps is achieved by inverter based interpolation technique with maximum delay spread of 2.5 ns at supply current <40 μA. Further, in typical condition of process, temperature and supply, static current consumption of the delay compensation circuit 600 is less than 30 μA ($I_{(W.C)}$<40 μA). FIG. 7a illustrates the simulation results of input and output signal at the delay line 202. The transient simulation results shows input signal Vin and the delayed versions of input signal at 26-taps as illustrated. Further, FIG. 7b illustrates the simulation results of the output signal at the interpolator 206a. A fine delay resolution of 82 ps and a delay spread of 2.5 ns can be measured from these results. FIGS. 8a and 8b illustrates variations in the third sensitive current and third summing current with process and temperature at a typical supply condition. At a typical supply condition, the third sensitive current and third compensation currents are shown at different temperatures for typical, slow and fast process corners. FIG. 9a illustrates variations in the third summing current with process and temperature at typical supply condition. At a typical supply condition, the third summing current is shown at different temperatures for typical, slow and fast process corners. The third summing current is also referred to as summing current profile and it varies least for slow process corner at different temperatures. The third summing current profile varies most for fast process corner at different temperatures. Further, FIG. 9b illustrates delay versus process variations for compensated and uncompensated delay line. Compensated delay line includes the three stage delay compensation circuit 600, whereas the uncompensated delay line does not include a delay compensation circuit. As illustrated in the figure, for uncompensated delay line, there is 260% delay variation with process variation. It can be inferred from the figure, that with the three stage delay compensation circuit 600, the delay variation is brought within 12%. Further, the delay varies from 1.41 ns to 1.57 ns with the compensated delay line. In case of the uncompensated delay line, the delay varies from 0.88 ns to 3.2 ns.

Figure 10A:
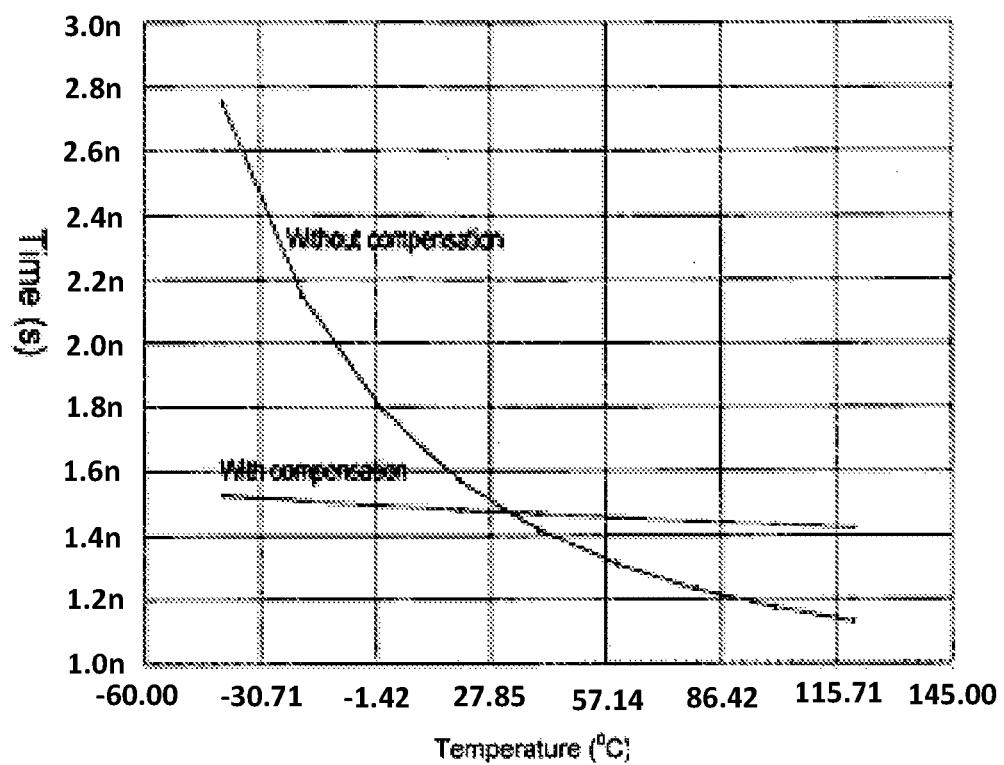
FIGS. 10a and 10b illustrates delay versus temperature and supply voltage variations for compensated and uncompensated delay line.
Figure 10B:
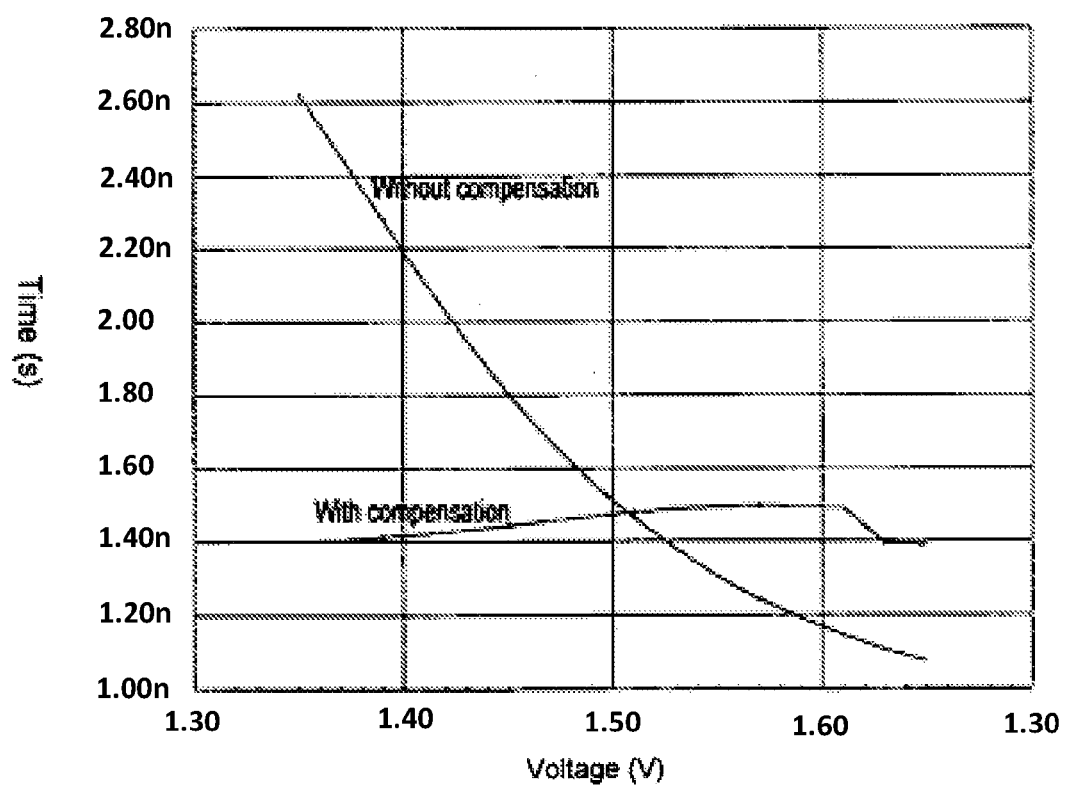

FIGS. 10a and 10b illustrates delay versus temperature and supply variations for compensated and uncompensated delay line. As shown in the FIG. 10a, the delay varies from 1.4 ns to 1.6 ns with the compensated delay line. In case of the uncompensated delay line, the delay varies from 1.0 ns to 3.0 ns. As shown in the FIG. 10b, the delay varies from 1.4 ns to 1.5 ns with the compensated delay line. In case of the uncompensated delay line, the delay varies from 1.0 ns to 2.62 ns.

I claim:
1. A delay compensation device comprising:
    a sensing unit for sensing process, supply voltage, and temperature (PVT) variations in a delay line;
    a sensitive current unit coupled to the sensing unit for generating a sensitive current based on the sensed PVT variations; and
    a current compensation unit coupled to the sensitive current unit for generating a compensation current based on the sensitive current, wherein the compensation current compensates for delay variations in the delay line,
    wherein the sensitive current is a mirrored current from the sensing unit.
2. The device of claim 1, further comprises:
    a biasing unit coupled to the sensitive current unit for compensating process skew by adjusting sensitivity of the sensitive current.
3. The device of claim 1, wherein the sensing unit includes a threshold voltage sensor for sensing process and temperature variations.
4. The device of claim 3, wherein the threshold voltage sensor has non-zero sensitivity for variations in the supply voltage.
5. The device of claim 1, wherein the current compensation unit generates the compensation current by subtracting the sensitive current from a reference current.
6. The device of claim 5, wherein the reference current is generated from a constant current source, and wherein the reference current is independent of the sensed PVT variations.
7. A system comprising:
    a delay line unit; and
    a delay compensation unit coupled to the delay line unit comprising:
        a sensing unit for sensing process, supply voltage, and temperature (PVT) variations in the delay line unit;
        a sensitive current unit coupled to the sensing unit for generating a sensitive current based on the sensed PVT variations; and
        a current compensation unit coupled to the sensitive current unit for generating a compensation current based on the sensitive current, wherein the compensation current compensates for delay variations in the delay line unit,
    wherein the sensitive current is a mirrored current from the sensing unit.
8. The system of claim 7, wherein the delay compensation unit further comprises a biasing unit coupled to the sensitive current unit for compensating process skew by adjusting sensitivity of the sensitive current.
9. The system of claim 7, wherein the current compensation unit generates the compensation current by subtracting the sensitive current from a reference current.
10. The system of claim 9, wherein the reference current is generated from a constant current source, and wherein the reference current is independent of the sensed PVT variations.

11. The system of claim 7, wherein the delay line unit is a current controlled delay line unit having at least one non-inverting NP-current controlled delay element.

12. A multi-stage delay compensation device comprising:
a sensing circuit for sensing process, supply voltage, and temperature (PVT) variations in a delay line;
a first stage circuit coupled to the sensing circuit comprising:
a first sensitive current circuit coupled to the sensing circuit for generating a first sensitive current based on the sensed PVT variations;
a first current compensation circuit coupled to the first sensitive current circuit for generating a first compensation current based on the first sensitive current; and
a first current mirror coupled to the first compensation circuit for generating a first summing current by mirroring the first compensation current; and
a second stage circuit cascaded with the first stage circuit comprising:
a second sensitive current circuit coupled to the sensing circuit for generating a second sensitive current based on the sensed PVT variations; and
a second current compensation circuit coupled to the second sensitive current circuit for generating a second compensation current, wherein the second compensation current compensates for the delay variations in the delay line.

13. The device of claim 12, wherein the sensing circuit includes a threshold voltage sensor for sensing process and temperature variations.

14. The device of claim 13, wherein the threshold voltage sensor has non-zero sensitivity for variations in the supply voltage.

15. The device of claim 12, wherein the first stage circuit further comprising a first biasing circuit coupled to the first sensitive current circuit for compensating process skew by adjusting sensitivity of the first sensitive current.

16. The device of claim 15, wherein the first sensitive current is a mirrored current from the sensing circuit.

17. The device of claim 16, wherein the first current compensation circuit generates the first compensation current by subtracting the first sensitive current from a reference current.

18. The device of claim 17, wherein the reference current is generated from a constant current source, and wherein the reference current is independent of the sensed PVT variations.

19. The device of claim 15, wherein the second stage circuit further comprising a second biasing circuit coupled to the second sensitive current circuit for compensating process skew by adjusting sensitivity of the second sensitive current.

20. The device of claim 19, wherein the second sensitive current is a mirrored current from the sensing circuit.

21. The device of claim 20, wherein the second current compensation circuit generates the second compensation current by subtracting the second sensitive current from the first summing current.

22. The device of claim 12, wherein the sensing circuit includes a PMOS transistor and a NMOS transistor.

23. The device of claim 15, wherein the first sensitive current circuit, the first current compensation circuit, and the first biasing circuit each includes a PMOS transistor.

24. The device of claim 12, wherein the first current mirror includes a NMOS transistor and PMOS transistor.

25. The device of claim 19, wherein the second sensitive current circuit, the second current compensation circuit, and the second biasing circuit each includes a PMOS transistor.

* * * * *